US006734414B2

(12) United States Patent
Street

(10) Patent No.: US 6,734,414 B2
(45) Date of Patent: May 11, 2004

(54) REDUCTION OF LINE NOISE APPEARANCE IN LARGE AREA IMAGE SENSORS

(75) Inventor: Robert A. Street, Palo Alto, CA (US)

(73) Assignee: Xerox Corporation, Stamford, CT (US)

(*) Notice: Subject to any disclaimer, the term of this patent is extended or adjusted under 35 U.S.C. 154(b) by 0 days.

(21) Appl. No.: 10/320,992

(22) Filed: Dec. 16, 2002

(65) Prior Publication Data

US 2003/0085340 A1 May 8, 2003

Related U.S. Application Data

(62) Division of application No. 09/428,393, filed on Oct. 28, 1999, now Pat. No. 6,593,557.

(51) Int. Cl.$^7$ .............................................. H01L 27/00
(52) U.S. Cl. ..................... 250/208.1; 348/302; 257/291
(58) Field of Search ......................... 250/208.1, 214 R; 348/241, 302, 303, 304, 305, 308; 257/291, 292, 443

(56) References Cited

U.S. PATENT DOCUMENTS 5,831,258 A * 11/1998 Street ...................... 250/208.1
6,011,531 A * 1/2000 Mei et al. ..................... 345/92

* cited by examiner

Primary Examiner—Kevin Pyo
(74) Attorney, Agent, or Firm—Kent Chen

(57) ABSTRACT

A method of minimizing line correlated noise in an imaging system is described. In the described embodiment, gate lines are used to access pixels in an array of pixels, and the output of the pixels are read out from output lines. By randomizing the connection or positioning of the lines such that each gate or read out is coupled to pixels in different columns or rows, the line correlation of noise is reduced.

12 Claims, 7 Drawing Sheets

REDUCTION OF LINE NOISE APPEARANCE IN LARGE AREA IMAGE SENSORS

CROSS-REFERENCE TO RELATED APPLICATIONS

This is a divisional of application Ser. No. 09/428,393; filed Oct. 28, 1999 U.S. Pat. No. 6,593,557.

FIELD OF THE INVENTION

The invention relates generally to the field of imaging and display devices.

BACKGROUND

Modern sensitive imaging systems are designed to detect objects emitting low levels of radiation. Medical diagnosis is a common application for such sensitive imaging systems. For example, a medical procedure may distribute low levels of radiation in an organ to allow imaging of the organ. Use of low radiation levels minimizes-damage to organs and surrounding tissue.

One problem with sensitive imaging systems designed to detect low levels of radiation is that the typically weak signals used in such systems may be lost in even small amounts of noise. Thus, reduction of noise is an important consideration in these systems. One example of an imaging system often used in medical applications is an amorphous silicon, (a-Si) image sensor. Amorphous silicon sensor arrays are well-known devices for imaging incident energy (see R. A. Street et al. "Amorphous Silicon Arrays Develop a Medical Image", *IEEE Circuits and Devices,* July 1993, pp. 38–42 and hereby incorporated by reference).

Traditional sensor systems include a two dimensional array of pixels. Address lines running across the array of pixels are used to receive information from or transfer information to each pixel in the array of pixels. The address lines communicate the output of the array of pixels one line at a time. Typically, such output is accomplished by asserting a gate line resulting in the parallel output of data along a plurality of data outputs lines. Fluctuations in voltage and other noise artifacts that affect the entire pixel array at the time of assertion of a gate line can cause noise in information transmitted by the data lines during the voltage fluctuations. The fluctuation or noise artifact results in a line of noise across the constructed image.

Typically, an amorphous silicon sensor system is formed using a two dimensional arrangement of perpendicularly arranged address lines with individual sensors or pixels at the intersection. When used in X-ray detection, each pixel may include a scintillation layer such as a phosphor converter or an X-ray photosensitive photoconductor, that generates visible light from the non-visible radiation being detected. In some designs, a detector in the pixel captures some of the visible light and converts the light photons to free electrons. A capacitor in the sensor stores the electrons.

A control circuit selectively and independently discharges each of the capacitors. The amount of discharge from each capacitor represents the amount of incident light reaching a corresponding pixel. By monitoring the outputs of the capacitors, a representation or image of the organ or object being imaged may be created.

Address lines, typically metallization lines, communicate information between the pixels and the control circuit. Each addressing line runs straight across the array. For purposes of this invention, an addressing line is defined to include a gate line used to address or transmit information to a pixel, a bias line used to bias the transistors in a pixel, as well as a data output line which may be used to read out or transfer information from a pixel.

The above describes sensor systems that are susceptible to generating line correlated noise when a fluctuation occurs across the sensor system. Thus an improved sensor design is needed.

SUMMARY OF THE INVENTION

When time dependent changes occur to an addressing line or to an entire sensor array, for example a fluctuation in bias voltage across the entire sensor array, or capacitive coupling between different address lines, the time-dependent fluctuation may appear as line-correlated noise in the image sensor system output. For purposes of this invention, line-correlated noise is an undesirable signal artifact that causes an undesirable change across a line in an image constructed from the sensor output. The noise problem is particularly acute in imaging systems designed to detect low level signals. In such systems, even small amounts of noise can produce a substantial drop in the signal to noise ratio.

Human vision is very sensitive to line-correlated noise. Thus, at a given noise level, most observers find a level of noise distributed as a line In a visual field to be significantly more noticeable than the same level of noise randomly distributed. It is generally accepted that line-correlated noise must substantially lower in amplitude than random pixel noise in order to reach the same level of noticeabillty.

In order to reduce the amount of line-correlated noise, the present invention redistributes the noise by reconfiguring address lines to address or receive data from pixels in at least two different pixel lines. Typically, the two pixel lines are two parallel or horizontal lines of pixels in an array of pixels. In one embodiment of the invention, a first segment of an address line addresses pixels in a first pixel line parallel to the address line and positioned on a first side of the address line. A second segment of the address line addresses pixels in a second pixel line parallel to the address line and positioned on a second side of the address line. Using each address line to address pixels in different pixel lines redistributes noise to reduce the line correlation of the noise. In other embodiments of the invention, the address line is "stepped" such that a first segment of the address line runs between a first and a second pixel line (either row or column) while a second segment of the address line runs between a second and a third pixel line. Stepping the line allows a single address line to address different pixel lines to redistribute the noise and reduce the line correlation.

DETAILED DESCRIPTION

Figure 1:
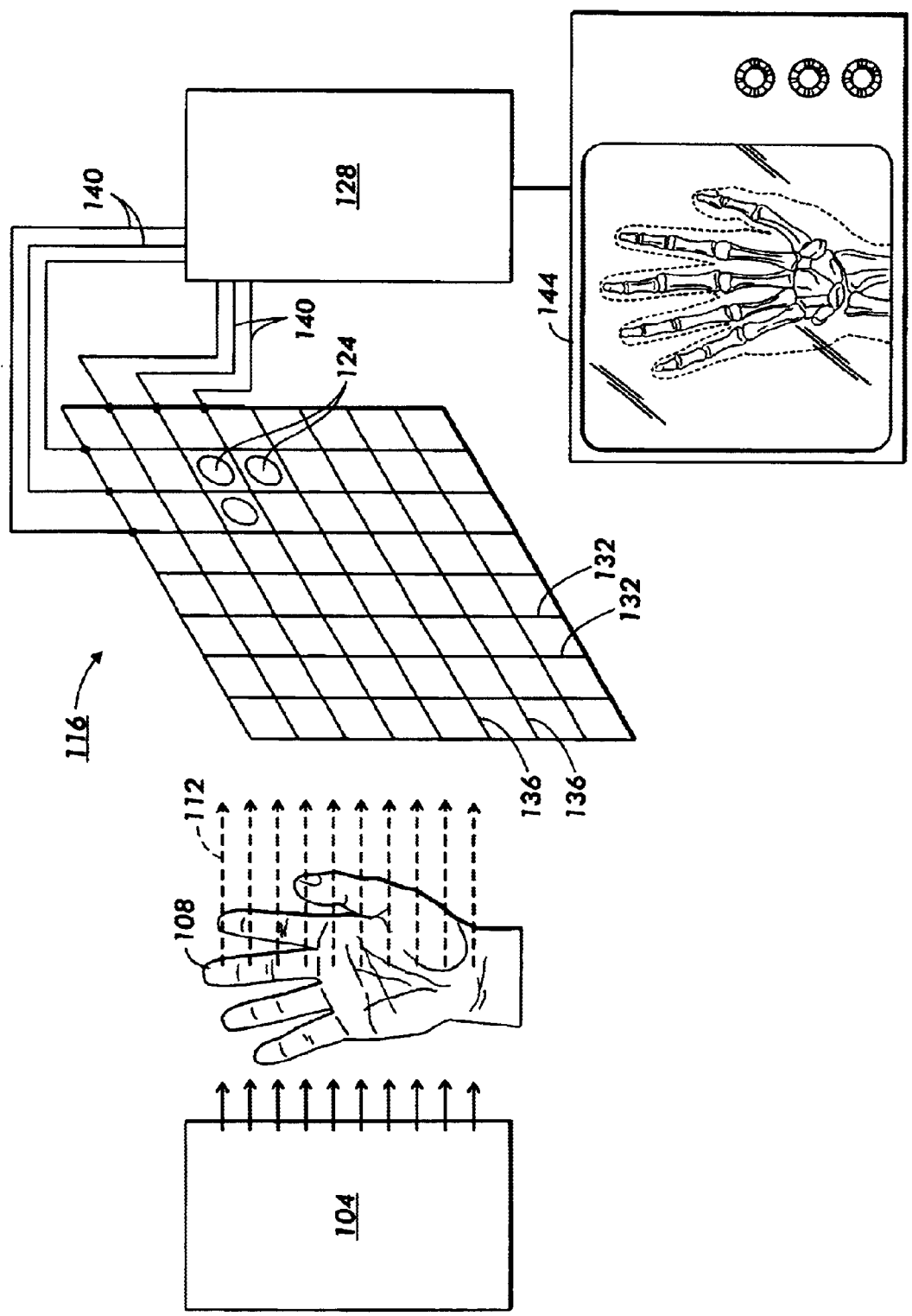
FIG. 1 illustrates a medical imaging system using one embodiment of a sensor array.

FIG. 1 illustrates a typical application of the invention in a medical imaging system. In FIG. 1, a radiation source 104, such as an X-ray machine irradiates an object 108 being imaged. The radiation 112 passes through object 108 and is incident on a sensor array 116. Sensor array 116 includes a plurality of pixels 124. Each of the pixels in the plurality of pixels 124 is capable of receiving and transmitting signals to and from control electronics 128 via a series of electrical conduits or address lines. Typically these electrical conduits include vertical running address lines 132 and horizontal running address lines 136. Wires 140 couple address lines 132, 136 to control electronics 128. In one embodiment of the invention, the address lines are metallization lines formed on a glass or a semiconductor substrate. As used in this application, address lines may include gate lines, sensor bias lines and output data lines, each of which will be later discussed in detail with reference to FIG. 2.

Control electronics 128 provides power, and/or a bias signal to the array of pixels 124, transmits address and/or output request signals to the pixels, and receives the output of the pixels along address lines 132, 136. Control electronics 128 processes the output of the pixels in sensor array 116 to generate data representing an image of object 108. The data may be stored, transmitted, modified, and may be displayed on an output device 144 such as a monitor, a printer, or other imaging device.

Figure 2:
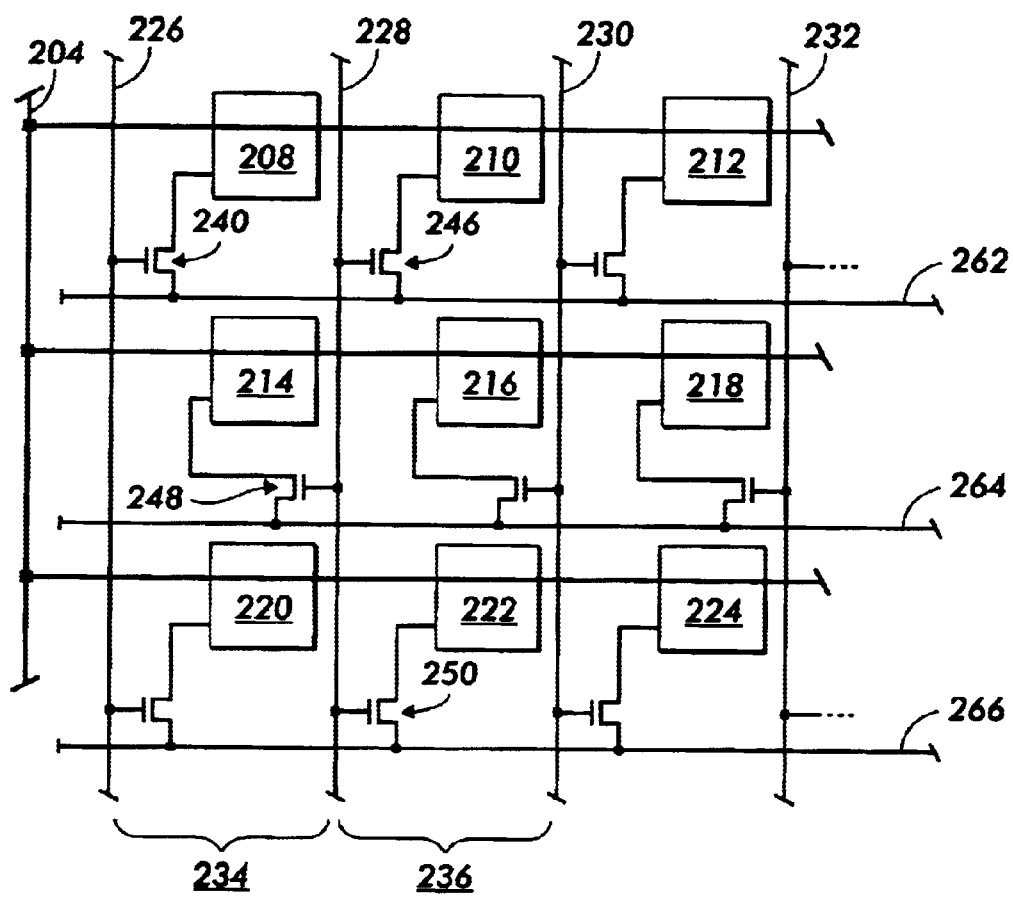
FIG. 2 is a circuit schematic illustrating the use of a dual sided address line in an array of pixels and TFT transistors.

FIG. 2 illustrates a circuit schematic of a matrix addressed detector array according to one embodiment of the present invention. A network 204 of bias lines provides a bias voltage to the pixels 208, 210, 212, 214, 216, 218, 220, 222, 224. Each pixel, such as pixel 208, is coupled to a corresponding transistor, such as transistor 240. In the illustrated embodiment, each gate line such as gate lines 226, 228, 230, 232 couples to the gates of several transistors in a column. For example, in the illustrated embodiment, gate line 228 couples to the gates of transistors 246, 248, 250.

Data is output from each pixel when a voltage is applied to the gate of a corresponding transistor. Thus, applying a voltage to a gate line such as gate line 228 causes transistors 246, 248, 250 coupled to gate line 228 to switch "on". When each transistor, such as transistor 246 switches on, corresponding pixels, such as pixel 210 transmits an output. The output from pixel 210 is transmitted along data output line 262. Likewise, switching "on" gate line 228 switches "on" transistor 248 and transistor 250 causing an output from corresponding pixel 214 and pixel 222. Data output line 264 carries the output signal from pixel 214 while data output line 266 carries the output signal from pixel 222.

In the illustrated embodiment, the connection of each gate line such as gate line 228 to pixels in different columns such as column 234 and column 236 reduces the amount of line correlation when noise is introduced. For example, when the applied bias voltage along any gate line 226, 228 or the sensor bias line 204 fluctuates, a drop in bias voltage (which may be a voltage along either sensor or gate lines) at a particular point in time may coincide with voltage readout from a line such as gate line 228. If all the pixels coupled to gate line 228 are in a single line, either column or row, the fluctuation will affect all the pixels in the column or row resulting in a noticeable line in the reconstructed image. However, when the gate line is coupled to pixels in two or more lines, the fluctuation in bias voltage or noise will not result in generation of a line of noise. Instead, the same noise will be distributed over several lines reducing the line correlation of the noise.

In FIG. 2, gate line 228 is coupled to and controls the output from pixel 210 in column 236 and pixel 214 in column 234. Thus, noise coinciding with pixel outputs resulting from an assertion of gate line 228 may be distributed between column 236 and column 234.

Figure 3:
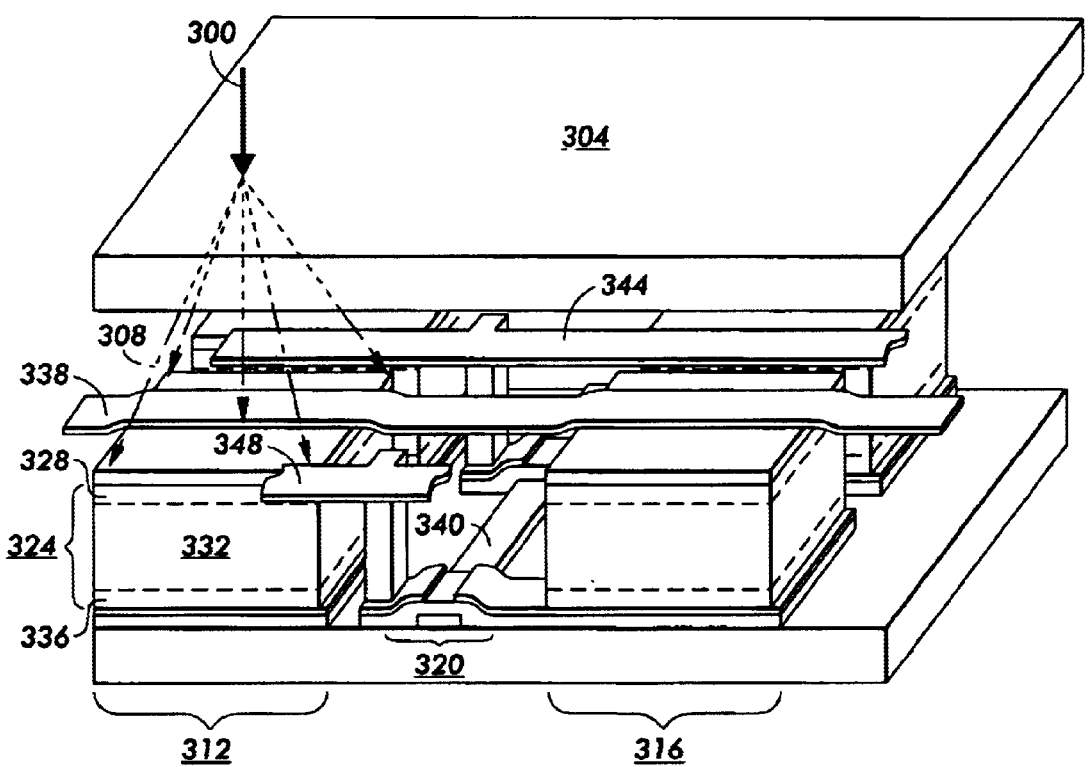
FIG. 3 illustrates a typical arrangement of columns and rows in a pixel array.

FIG. 3 illustrates a semiconductor structure including bias lines, data output lines and gate lines coupled to a pixel. In the illustrated embodiment, an X-ray photon 300 strikes a phosphor layer 304 generating light photons 308. The light photons 308 enters a pixel element such as pixel element 312 where it can be detected. The described structure is described in the previously referenced article by R. A. Street and L. E. Antonuk entitled "Amorphous Silicon Arrays Develop a Medical Image".

In the illustrated embodiment, each pixel element such as pixel element 316 includes a thin film transistor (TFT) 320 coupled to an amorphous silicon sensor 324. The illustrated amorphous silicon sensor 324 includes a top p doped layer 328, an intrinsic layer 332, and an n doped layer 336. Illumination from light photons 308 create electron-hole pairs that are moved by an internal electric field of the sensor and stored in the intrinsic capacitance of the sensor (typically about 1 pF for a 100×100 micrometer square size). Bias line 338 provides the voltage used to maintain the internal electric field as well as biasing for the TFT 320.

When a control circuit is ready to receive the output signal of sensor 324, the control circuit transmits an asserted or "on" voltage signal along gate line 340. The "on" voltage signal along gate line 340 causes the sensors coupled to gate line 340 to transmit stored charges along corresponding data output lines such as data output lines 344, 348. In prior art systems, the sensors corresponding to a gate line such as gate line 340 are arranged in a line such as a column or a row of a rectangular array of pixels. FIG. 2 and FIGS. 4–7, illustrate embodiments of the invention in which a single gate line, such as gate line 340, is coupled to sensors in different columns.

Figure 4:
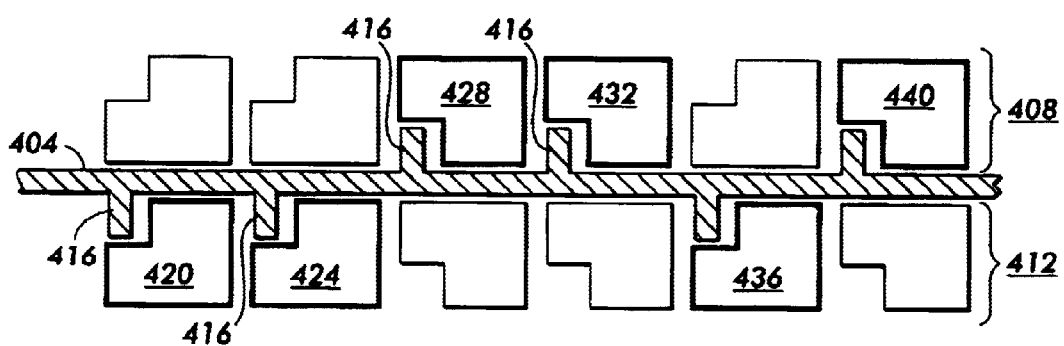
FIG. 4 shows the interconnections of a dual sided address line used to address pixels on both sides of the address line.

FIG. 4 shows a dual sided gate line 404 positioned between adjacent lines 408, 412 of pixels. Spurs or intermediate connectors 416 are coupled to both sides of dual sided gate line 404. The placement of intermediate connectors 416 allow gate line 404 to access pixels on both sides of the gate line. Each intermediate connector couples the gate line to a corresponding pixel such as pixels 420, 424, 428, 432, 436, 440.

The pixels coupled to gate line 404 include pixels in both lines 408, 412 (including either rows or columns). For example, dual sided gate line 404 is coupled to pixels 420, 424, 436 in a first line 412 on a first side of the gate line. Dual sided gate line 404 also is coupled to pixels 428, 432, 440 in a second line 408 on a second side of the gate line. Coupling different segments of dual sided gate line 404 to pixels in different lines 408, 412 reduces the linear correlation that results when a fluctuation in bias voltage occurs. One advantage of using a dual sided gate line is that no additional array area is needed to route gate line 404 compared to traditional designs in which a single gate line addresses a single line of pixels.

A control circuit receives the data from the pixels along data output lines (not shown). In one circuit layout, the data output lines are perpendicularly oriented with respect to the gate line such that when a gate line is asserted, each data output line transmits information on a corresponding pixel of data. A processor in the control circuit is programmed to match the output of each data output line, when a particular gate line is asserted, to a corresponding pixel location on a display device. Thus when the pixel locations addressed by a gate line forms a nonlinear pattern (a nonlinear pattern is defined as a pixel pattern that does not form a line, either column or row), the control circuit arranges the data from the output lines to correspond to the nonlinear pattern.

A number of methods may be used by the control circuit to rearrange data from the output lines. When a gate line is asserted, a plurality of data output lines transmit in parallel data from the pixels coupled to the gate line. When the gate line is coupled to a linearly arranged set of pixels, the parallel output of the data output lines automatically provides a data set that forms a line. Thus, to display the information in a raster scan, the data may be displayed as received from the parallel output. When buffering is used prior to display of the constructed image, the control circuitry may linearly address or read out the data in the buffer.

However, when a gateline is connected to a set of pixels that are nonlinear, the parallel output from the plurality of lines will typically not be directly displayable. Instead, in one embodiment, the data from the pixels is buffered into a memory device such as random access memory (RAM). The control circuit is preprogrammed with the routing of the gate line and thus contains information on which memory address locations contain data that forms a line (or raster scan) of data for a display device. When the display device requests a line of data to construct an image, the control circuitry retrieves data that corresponds to the line being requested. The data for a line of the constructed image is transmitted from the array of pixels of the sensor at different times and is the result of the assertion of different gate lines.

Figure 5:
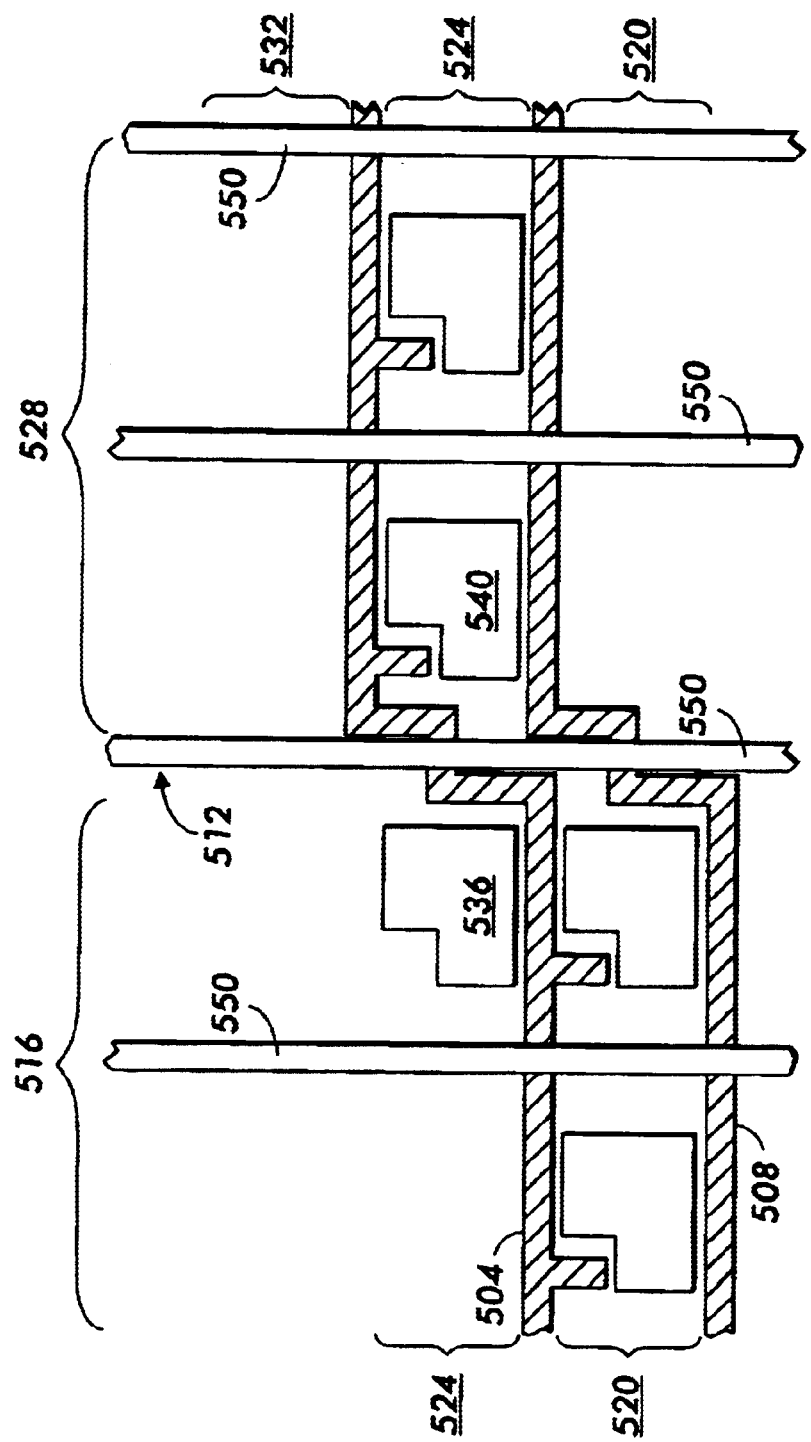
FIG. 5 illustrates randomization of an address line by shifting the address line at a shift plane.

FIG. 5 illustrates a second circuit structure for adjusting the output of a sensor to output data from pixels in different pixel lines when a gate line is asserted. FIG. 5 shows two gate lines 504, 508 undergoing a shift at a plane, illustrated in FIG. 5 as shift plane 512. In FIG. 5, a first segment of each gate line such as first line segment 516 of gate line 504 is positioned between a first line 520 of pixels and a second line 524 of pixels. A second line segment 528 of gate line 504 is positioned between a second line 524 of pixels and a third line 532 of pixels.

The shift of gate line 504 occurs along shift plane 512. Shift planes, such as shift plane 512 are positioned between adjacent pixels in a pixel line such as pixel 536 and pixel 540 of pixel line 524. The orientation of a shift plane is typically perpendicular to each line segments of the gate line. In some embodiments of the invention, data output lines such as data output line 550 may be oriented in parallel with the shift plane.

Line correlation of noise may be further reduced by adding additional shifts along additional shift planes. Each additional shift plane is parallel to shift plane 512. Each additional shift along a shift plane produces an additional gate line segment coupled to pixels in an additional line of pixels. Additional randomization may also be achieved by replacing the standard gate line such as gate line 504 and gate line 508 with dual sided gate lines. Replacing the gate lines of FIG. 5 with the dual sided gate line of FIG. 4 provides one extra degree of shift to each gate line without using additional array area. Extra shifts are particularly useful when the separation between gate lines is less than 6 arcseconds. A human eye can detect up to about six arcseconds of separation, after which two elements begin to merge into one element.

In the design of FIG. 5, each shift in all gate lines occur along a common shift plane. The common shift plane of all the gate lines creates the possibility of inducing a correlated effect along the shift plane which may manifest as noise along the shift plane. A correlated effect may occur along the shift plane when pixels near the shift plane have slightly different responses from other pixels on the sensor. Such a change in response may be caused by a sensitivity change in pixels near the shift plane due to the presence of the shifted gate line.

Figure 6:
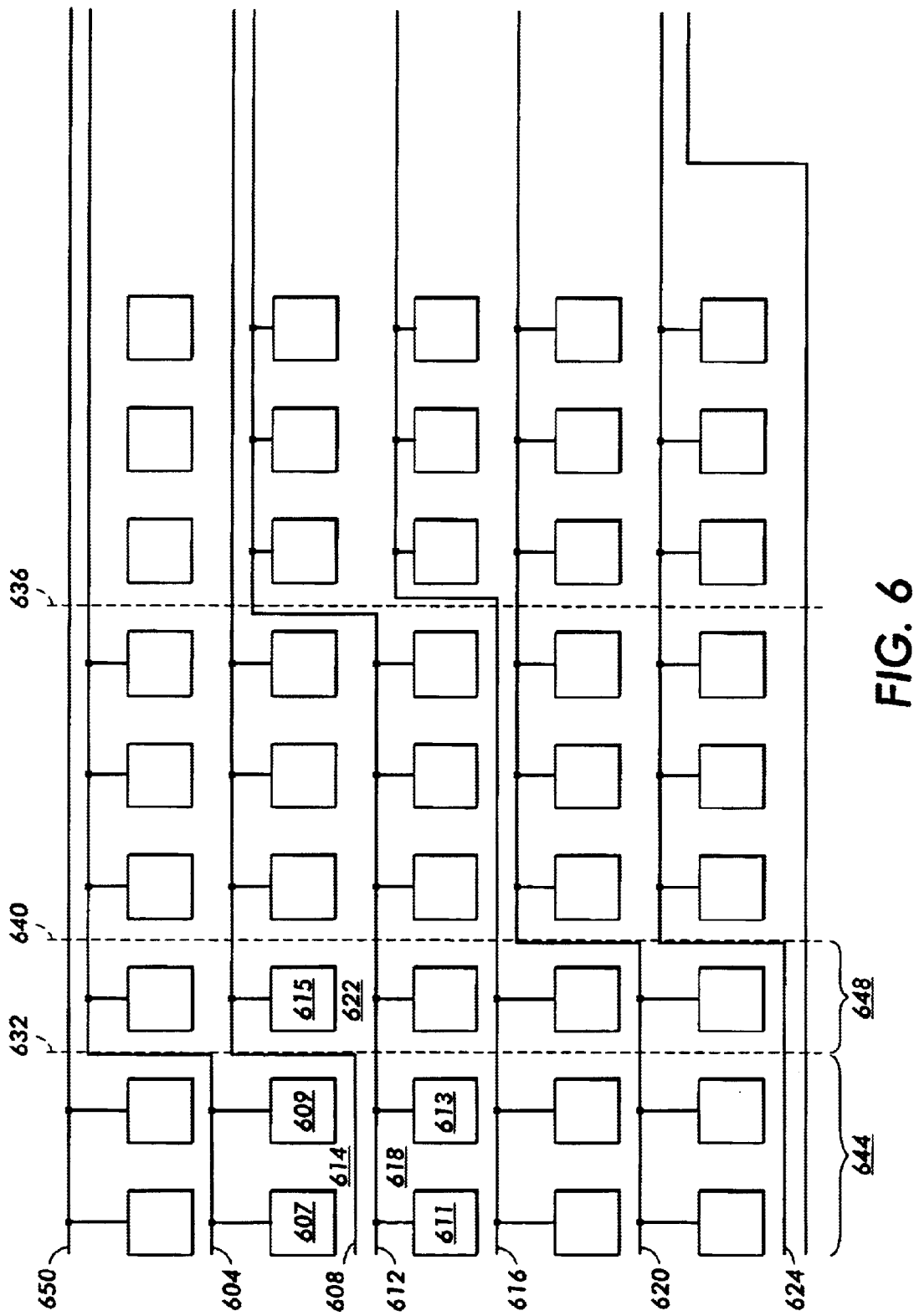
FIG. 6 illustrates a modification of the system of claim 5 wherein a plurality of address lines are shifted, some of the address lines shifted in different shift planes.

An alternate solution for preventing an artifact near the shift plane is illustrated in FIG. 6. FIG. 6 illustrates a plurality of gate lines 604, 608, 612, 616, 620, 624 that shift at different shift planes, each shift plane corresponding to at least one gate line. Because each gate line shifts independently of the other gate lines, the array of pixels lacks a common shift plane in which all gate lines shift. For example, a first pair of gate lines 604, 608 shift along first shift plane 632 while a second pair of gate lines 612, 616 shift along second shift plane 636 and a third pair of gate lines 620, 624 shift along third shift plane 640. The shifting of different gate lines along different shift planes minimizes the line correlation of artifacts, such as a change in sensitivity, that may be caused by shifting all gate lines along one shift plane.

FIG. 6 also illustrates the use of additional lines or dummy gate lines to allow all pixels in a sensor array to be addressed when a gate line is shifted. For purposes of this invention, a dummy gate line is a gate line that addresses fewer pixels than the median number of pixels addressed by all the gate lines in the sensor. Thus a dummy gate line typically includes a substantial segment extending along the sensor array in which the dummy gate line is not coupled to any pixels.

The additional dummy gate lines create a higher density of gate lines through the sensor array than is typically used in sensor systems which do not shift gate lines. In traditional sensor systems, the number of gate lines is equal to approximately the number of pixel rows or the number of pixel columns. For example, in a typical 1000×1000 array of pixels, typically 1000 gate lines are used, one gate line for addressing each row of pixels. However, the use of dummy gate lines increases the number of gate lines such that the number of total number of gate lines exceeds the number of pixel rows or columns. Typically, the amount of increase is approximately 10% for a total of approximately 1100 gate lines in a 1000×1000 array of pixels.

The additional gate lines address regions which would otherwise be unaddressed after shifting. For example, in an initial segment of the sensor array, such as segment 644, only one gate line is needed to address the pixels on a first side of gate line 608 and gate line 612. Assuming in the illustrated embodiment that each gate line handles pixels beneath the gate line, gate line 604 addresses pixels 607, 609 in region 614 directly above gate lines 608, 612 while either gate line 608 or gate line 612 (gate line 612 in the illustrated embodiment) addresses pixels 611, 613 in region 618 directly below the pair of gate lines 608, 612. Thus in initial segment 644 of the sensor array, gate line 608 is redundant, and unnecessary to address pixels in the first segment. When gate line 604 shifts, gate line 608 also shifts. The shift of gate line 608 allows gate line 608 to address pixel 615 in region 622. Pixel 615 would have been addressed by gate line 604 in segment 648 if the shift at plane 632 had not occurred. When gate line 608 shifts, gate line 608 is no longer redundant in region 648, instead another gate line, such as gate line 650 becomes redundant in region 648.

In an alternative embodiment, gate line 608 is implemented as a dual sided gate line of the type illustrated in FIG. 4. A dual sided implementation of gate line 608 would allow addressing of pixel 615 in region 622 without shifting gate line 608.

Figure 7:
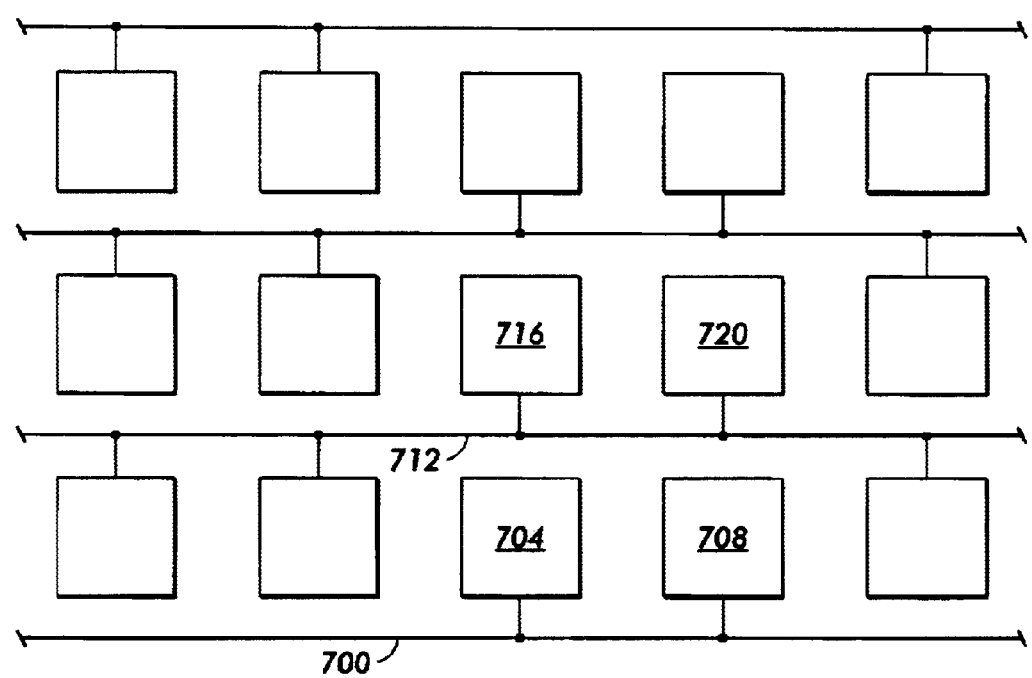
FIG. 7 illustrates the use of dummy address lines in a sensor utilizing a dual sided address line.

FIG. 7 illustrates dummy or additional gate lines used to assure the addressing of all pixels in the sensors of FIG. 4 and FIG. 5. In FIG. 4, typically only one additional dummy gate line is used. The additional gate line 700 runs near an edge of the sensor array to address pixels 704, 708 at the edge of the sensor which would otherwise be unaddressed when the adjacent dual sided gate line 712 addresses pixels 716, 720 on an opposite side. In FIG. 5, typically the number of dummy lines needed is equal to the number of planes in which a shift occurs. As in FIG. 5, the additional gate lines address pixels which would otherwise be unaddressed due to the shift.

Data output lines communicate information from the sensor to a control circuit. The control circuit, including a processor such as a video processor, receives the data from the data output lines and constructs the image detected by the sensor array. In the prior art, each gate line is coupled to a single line of pixels. Thus an asserted signal on the gate line causes the data output lines to transfer in a parallel output the contents of a single line of pixels. Connecting each gate line to pixels in two or more different lines results in a parallel output of intermixed data from multiple pixel lines when each gate line is asserted.

In order to properly reconstruct an image from parallel outputs of intermixed data, the processor buffers the data in a memory until sufficient data to recreate a line of pixels is received. The processor then maps the received data to the path of the gate line. The mapping operation may involve rearranging the data from a several different parallel outputs. In particular, the mapping operation may include the operation of interleaving data received at different times from the assertion of different gate lines to reconstruct each line of pixels in the sensor device.

While the preceding invention has been described in terms of a number of specific embodiments, it will be evident to those skilled in the art that many alternatives, modifications, and variations are within the scope of the teachings contained therein. For example, although the description has taken place in the context of describing a gate line in a sensor array, the randomization of lines may also occur in any imaging device, including display devices that output an image to prevent line correlation across the image display. Any line that generates noise or communicates noise may be randomized using the shift techniques or the dual sided addressing techniques claimed. Accordingly, the present invention should not be limited by the embodiments used to exemplify it, but rather should be considered to be within the spirit and scope of the following claims and its equivalents, including all such alternatives, modifications and variations.

What is claimed is:

1. An imaging apparatus comprising:
   one line of pixels;
   a first addressing line approximately parallel to and immediately adjacent to a first side of the one line of pixels, the first addressing line to address a first set of pixels in the one line of pixels, the first set of pixels exclusively addressed by said first addressing line; and,
   a second addressing line approximately parallel to and immediately adjacent to a second side of the one line of pixels, the second addressing line to address a second set of pixels in the one line of pixels.

2. The imaging apparatus of claim 1 wherein a first set of stubs couples a first side of each pixel in the first set of pixels to the first addressing line and a second set of stubs couples a second side of each pixel in the second set of pixels to the second addressing line.

3. The imaging apparatus of claim 1 wherein the second set of pixels of pixels is exclusively addressed by said second addressing line.

4. The imaging apparatus of claim 1 wherein every pixel in the one line of pixels is either in the first set of pixels or in the second set of pixels.

5. The imaging apparatus of claim 3 wherein every pixel in the one line of pixels is either in the first set of pixels or in the second set of pixels.

6. The imaging apparatus of claim 1 further comprising:
   a second line of pixels approximately parallel to and immediately adjacent to a second side of the first addressing line, the first addressing line including a first line segment that exclusively addresses the first set of pixel in the one line of pixels, the first addressing line further including a second line segment that exclusively addresses a second set of pixels in the second line of pixels, the second line segment addresses no other pixels other than said second set of pixels.

7. The imaging apparatus of 6 claim wherein the first set of pixels in the one line of pixels is addressed only by said first line segment of said first addressing line and no other addressing line oriented approximately parallel to the one line of pixels and wherein the second set of pixels is addressed only by said second addressing line segment and no other addressing line oriented approximately parallel to the one line of pixels.

8. The imaging apparatus of claim 6 wherein the first line segment couples to the first set of pixels in the one line of pixels using a first series of stubs on a first side of the first addressing line, and the second line segment couples to the second set of pixels using a second series of stubs on a second side of the first addressing line.

9. The imaging apparatus of claim 6 wherein the first addressing line is positioned between the one line of pixels and the second line of pixels.

10. An imaging apparatus comprising:
    a first addressing line; and,
    a first line of pixels oriented approximately parallel to the first addressing line, the first line of pixels including a first set of pixels exclusively addressed by said first addressing line, the first line of pixels including a second set of pixels not addressed by the first addressing line, the second set of pixels exclusively addressed by a second addressing line.

11. An imaging apparatus comprising:
    one line of pixels;
    a first gate addressing line approximately parallel to and immediately adjacent to a first side of the one line of pixels, the first gate addressing line to address a first set of pixels in the one line of pixels, said first gate addressing line being the only gate line addressing said first set of pixels; and,
    a second gate addressing line approximately parallel to and immediately adjacent to a second side of the one line of pixels, the second gate addressing line to address a second set of pixels in the one line of pixels.

12. The imaging apparatus of claim 11 wherein the second gate addressing line is the only gate line addressing said second set of pixels.

* * * * *

UNITED STATES PATENT AND TRADEMARK OFFICE
CERTIFICATE OF CORRECTION

PATENT NO. : 6,734,414 B2
DATED : May 11, 2004
INVENTOR(S) : Robert A Street

It is certified that error appears in the above-identified patent and that said Letters Patent is hereby corrected as shown below:

Column 1,
Line 8, insert as a new paragraph:
-- This invention was made with United States Government support under Agreement No. 70NANB7H3007 awarded by NIST. The United States Government has certain rights in this invention. --.

Signed and Sealed this

Sixth Day of June, 2006

JON W. DUDAS
*Director of the United States Patent and Trademark Office*